(12) United States Patent
Fan et al.

(10) Patent No.: US 10,943,929 B2
(45) Date of Patent: Mar. 9, 2021

(54) DISPLAY PANEL AND DISPLAY DEVICE

(71) Applicant: Xiamen Tianma Micro-Electronics Co., Ltd, Xiamen (CN)

(72) Inventors: Liujing Fan, Xiamen (CN); Lijing Han, Xiamen (CN); Zhiyong Xiong, Xiamen (CN); Di Zhu, Xiamen (CN)

(73) Assignee: Xiamen Tianma Micro-Electronics Co., Ltd, Xiamen (CN)

( * ) Notice: Subject to any disclaimer, the term of this patent is extended or adjusted under 35 U.S.C. 154(b) by 0 days.

(21) Appl. No.: 16/422,839

(22) Filed: May 24, 2019

(65) Prior Publication Data
US 2020/0185427 A1    Jun. 11, 2020

(30) Foreign Application Priority Data

Dec. 11, 2018    (CN) .......................... 201811507585.0

(51) Int. Cl.
*H01L 27/12* (2006.01)
(52) U.S. Cl.
CPC ...... *H01L 27/1244* (2013.01); *H01L 27/1248* (2013.01); *H01L 27/1255* (2013.01)
(58) Field of Classification Search
CPC ............. H01L 27/1244; H01L 27/1248; H01L 27/1255; H01L 27/124; G09F 9/30; G06K 9/0004; G09G 3/3233; G09G 3/3225; G09G 2300/0426; G09G 2300/0819;

(Continued)

(56) References Cited

U.S. PATENT DOCUMENTS

2009/0135104 A1* 5/2009 Jeong ................. H01L 27/3276
345/76
2014/0167009 A1* 6/2014 Lee ..................... H01L 23/5225
257/40

(Continued)

FOREIGN PATENT DOCUMENTS

CN         102891164 A    1/2013
CN         104614910 A    5/2015
(Continued)

OTHER PUBLICATIONS

First Office Action dated Jun. 11, 2020, issued in corresponding Chinese Application No. 201811507585.0, filed Dec. 11, 2018, 16 pages.

*Primary Examiner* — Bitew A Dinke
(74) *Attorney, Agent, or Firm* — Christensen O'Connor Johnson Kindness PLLC

(57) ABSTRACT

A display panel and a display device are provided. The display panel includes: a plurality of pixel circuits arranged in a matrix; a data line extending in a first direction and being electrically connected to the plurality of pixel circuits; a power signal line extending in the first direction and being electrically connected to the plurality of pixel circuits; an inorganic passivation layer located on surfaces, facing toward a light-emitting surface of the display panel, of the data line and the power signal line; and an anti-crosstalk structure. An orthographic projection of at least partial region of the anti-crosstalk structure on a plane of the display panel is located between an orthographic projection of the data line and an orthographic projection of the power signal line on the plane of the display panel.

16 Claims, 8 Drawing Sheets

(58) Field of Classification Search
CPC ... G09G 2300/0842; G09G 2300/0861; G09G 2310/0262; G09G 2354/00
See application file for complete search history.

(56) References Cited

U.S. PATENT DOCUMENTS

| | | | |
|---|---|---|---|
| 2016/0148985 A1* | 5/2016 | Park | H01L 27/3262 |
| | | | 257/40 |
| 2016/0307968 A1* | 10/2016 | Yoon | G06F 3/044 |
| 2017/0179210 A1* | 6/2017 | Kimura | H01L 51/0097 |
| 2018/0033850 A1* | 2/2018 | Gang | H01L 27/322 |
| 2018/0138259 A1* | 5/2018 | Kim | H01L 27/3279 |
| 2018/0165498 A1* | 6/2018 | Xie | G09G 3/3233 |
| 2018/0331171 A1* | 11/2018 | Kim | H01L 27/3265 |
| 2019/0279575 A1* | 9/2019 | Kim | G09G 3/3225 |

FOREIGN PATENT DOCUMENTS

| | | |
|---|---|---|
| CN | 106816457 A | 6/2017 |
| CN | 106855674 A | 6/2017 |

* cited by examiner

DISPLAY PANEL AND DISPLAY DEVICE

CROSS-REFERENCE TO RELATED APPLICATIONS

The present application claims priority to Chinese Patent Application No. 201811507585.0, filed on Dec. 11, 2018, the content of which is incorporated herein by reference in its entirety.

TECHNICAL FIELD

The present disclosure relates to the field of display technologies and, particularly, relates to a display panel and a display device.

BACKGROUND

In recent years, in order to increase a resolution and a screen-to-body ratio of a display panel, signal lines in the display panel are arranged more and more densely, which inevitably causes a coupling effect between the signal lines. Most seriously, with the continuous decrease of the gap between the data line and the power signal line in the display panel, a significant coupling effect occurs between the data line and the power signal line, which then affects the data signal transmitted on the data line, causing the data signal to deviate from the target value. In addition, crosstalk may occur to the images displayed on the display panel, and in a severe case, the images are displayed in a split view, seriously affecting performance of the display.

SUMMARY

In view of this, the present disclosure describes a display panel and a display device, which can alleviate the coupling effect between a power signal line and a data line, and improve display performances.

In a first aspect, the present provides a display panel, and the display panel includes: a plurality of pixel circuits arranged in a matrix; a data line extending in a first direction and electrically connected to the plurality of pixel circuits; a power signal line extending in the first direction and electrically connected to the plurality of pixel circuits; an inorganic passivation layer located on surfaces, facing toward a light-emitting surface of the display panel, of the data line and the power signal line; and an anti-crosstalk structure, where an orthographic projection of at least partial region of the anti-crosstalk structure on a plane of the display panel is located between an orthographic projection of the data line and an orthographic projection of the power signal line on the plane of the display panel.

In a second aspect, the present disclosure provides a display device, and the display device includes the above-mentioned display panel.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. Other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in front and at the back of "/" is an "or" relationship.

Figure 1:
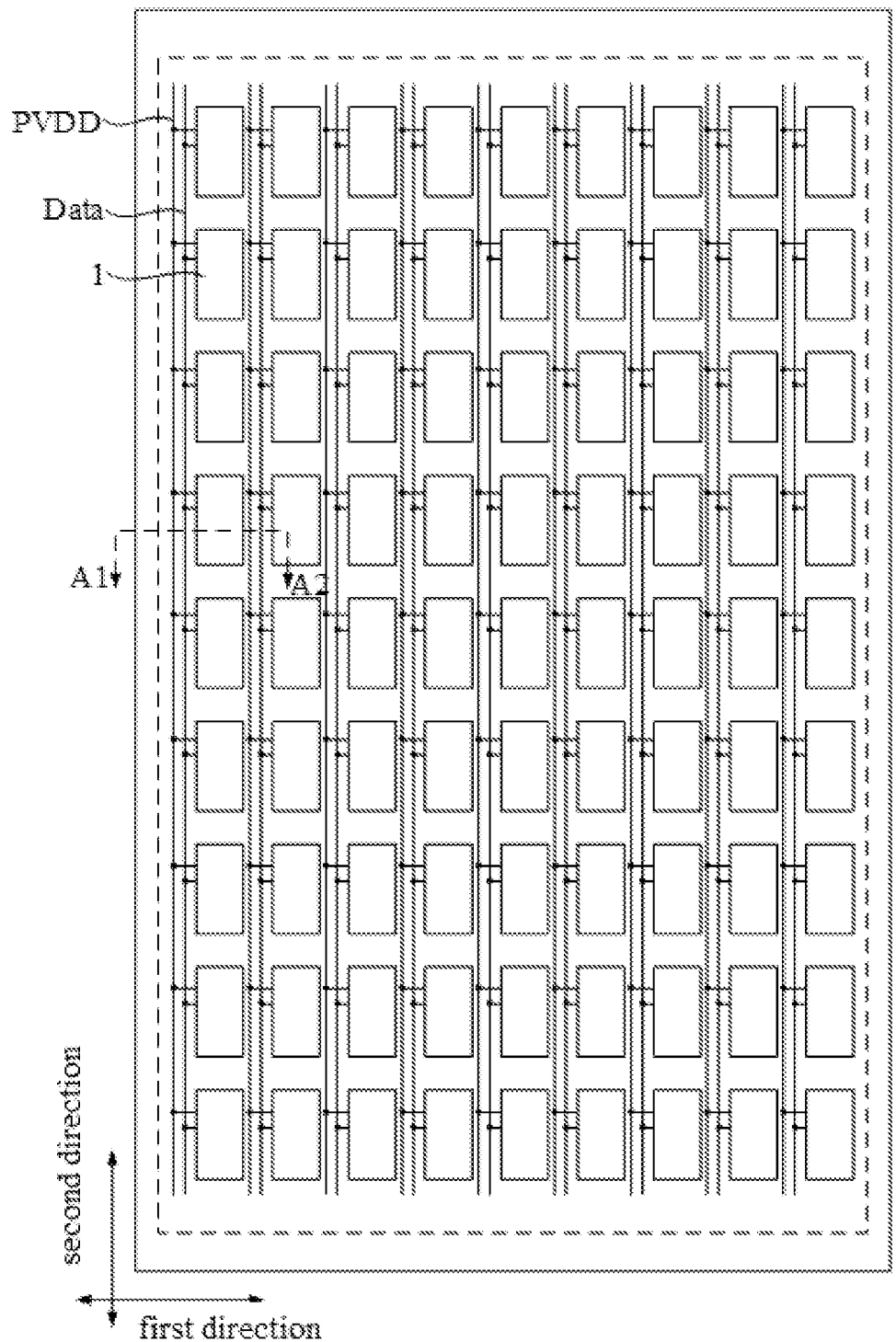
FIG. 1 is a structural schematic diagram showing a display panel according to an embodiment of the present disclosure.
Figure 2:
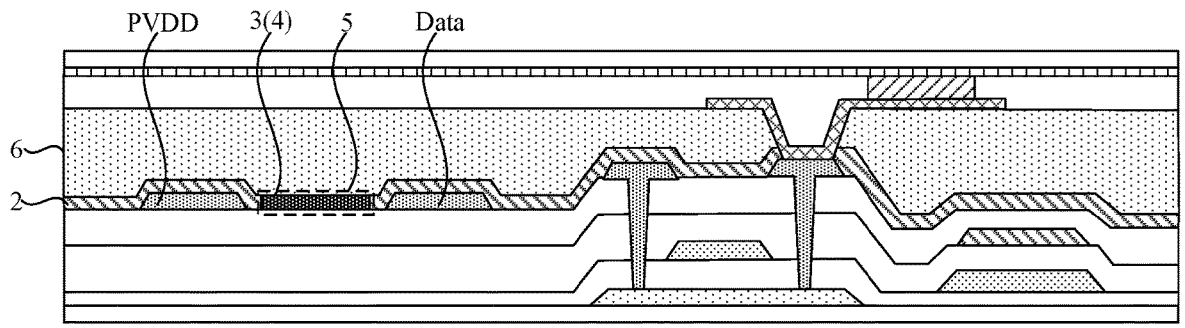
FIG. 2 is a cross-sectional view taken along the direction A1-A2 in FIG. 1.

The present disclosure provides a display panel. FIG. 1 is a structural schematic diagram showing a display panel according to an embodiment of the present disclosure; and FIG. 2 is a cross-sectional view taken along the direction A1-A2 in FIG. 1. As shown in FIGS. 1 and 2, the display panel includes a plurality of pixel circuits 1 arranged in a matrix, a data line Data, a power signal line PVDD, and an inorganic passivation layer 2. The data line Data extends in a first direction, and is electrically connected to the plurality of pixel circuits 1 and is configured to transmit a data signal to the plurality of pixel circuits 1. The power signal line PVDD extends in the first direction, and is electrically connected to the pixel circuit 1 and configured to transmit a power signal to the plurality of pixel circuit 1. The inorganic passivation layer 2 is located on surfaces, facing toward a light-emitting surface of the display panel, of the data line Data and the power signal line PVDD, and is used for preventing intrusion of water and oxygen and avoiding the corrosion to the data line Data and the power signal line PVDD caused by water and oxygen.

In addition, the display panel further includes an anti-crosstalk structure 3. An orthographic projection (also referred to as an orthogonal projection) of at least partial region of the anti-crosstalk structure 3 on a plane of the display panel is located between an orthographic projection of the data line Data and an orthographic projection of the power signal line PVDD on the plane of the display panel.

In the display panel provided by the embodiments of the present disclosure, the anti-crosstalk structure 3 may be made of a material having a relatively small dielectric constant or a metal material, and it is further set that at least partial region of the anti-crosstalk structure 3 is located between the data line Data and the power signal line PVDD, so that the anti-crosstalk structure 3 can function to alleviate the coupling effect between the data line Data and the power signal line PVDD, thereby reducing the influence of the coupling effect on the data signal transmitted on the data line Data, making the data signal approximate to the target value, effectively eliminating the crosstalk phenomenon of the displayed images and improving the display performance.

In some embodiments of the present disclosure, referring to FIG. 2 again, the anti-crosstalk structure 3 is an organic layer 4, the inorganic passivation layer 2 has a hollow region 5, and the organic layer 4 is located in the hollow region 5. Meanwhile, the organic layer 4, the data line Data and the power signal line PVDD are arranged in a same layer.

According to a capacitance formula $$C = \frac{\varepsilon \times S}{4 \times \pi \times k \times d},$$

where k is an electrostatic force constant, $\varepsilon$ is a dielectric constant, d is a spacing between two directly opposite electrode plates of a capacitor, and S is an overlapping area between the two directly opposite electrode plates of the capacitor, it can be shown that, compared with arranging the inorganic passivation layer 2 between the data line Data and the power signal line PVDD, the coupling capacitance formed between the data line Data and the power signal line PVDD can be reduced by providing the hollow region 5 in the inorganic passivation layer 2 and by filling the hollow region 5 with an organic material having a low dielectric constant such that the organic material is located between the data line Data and the power signal line PVDD, thereby reducing the influence of the coupling capacitance on the data signal and improving display uniformity.

Further, regarding the small spacing between the current data line Data and power signal line PVDD, after the organic layer 4 having no conductivity is arranged between the data line Data and the power signal line PVDD, the signals transmitted on the data line Data and the power signal line PVDD will not be influenced even if the organic layer 4 contacts the data line Data and the power signal line PVDD. Therefore, by using the organic layer 4 as the anti-crosstalk structure 3, the data line Data and the power signal line PVDD can maintain the original spacing there between, and there is no need to increase the spacing between the data line Data and the power signal line in order to prevent the organic layer 4 from interfering with the data signal and the power signal, so that a better design with a high resolution and a high screen-to-body ratio can be realized.

The inorganic passivation layer 2 is generally made of a silicon oxide material having a dielectric constant of 4.2. In order to ensure that the organic layer 4 can reduce the coupling capacitance formed between the data line Data and the power signal line PVDD, it is required that the dielectric constant of the organic layer 4 in the hollow region 5 should be lower than the dielectric constant of the inorganic passivation layer 2. Therefore, when the dielectric constant of the organic layer 4 is $\varepsilon$, $\varepsilon$ may satisfy: $1 \le \varepsilon \le 3$.

Figure 3:
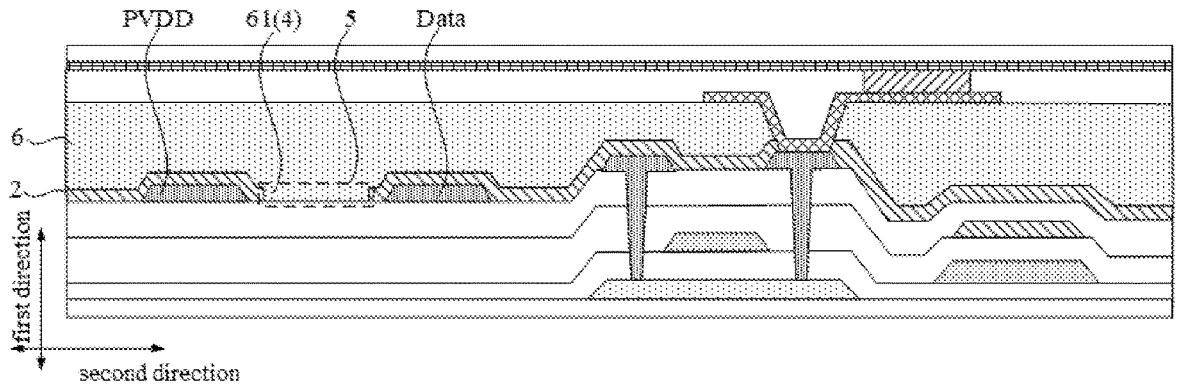
FIG. 3 is a structural schematic diagram showing an anti-crosstalk structure according to an embodiment of the present disclosure.

FIG. 3 is a structural schematic diagram showing an anti-crosstalk structure according to an embodiment of the present disclosure. As shown in FIG. 3, the display panel further includes a planarization layer 6 configured to planarize the film layers. The planarization layer 6 is located on a surface of the inorganic passivation layer 2 facing toward the light-emitting surface of the display panel. The planarization layer 6 (for ease of understanding, a portion of the planarization layer 6 deposited in the hollow region 5 in FIG. 3 is denoted by a reference number 61) deposited in the hollow region 5 is reused as the organic layer 4. The planarization layer 6 is made of an organic material having a relatively small dielectric constant, a portion of the planarization layer 6 is directly deposited in the hollow region 5, and this portion of the partial planarization layer 6 is reused as the anti-crosstalk structure 3. As a result, there is no need to additionally provide an organic layer 4 under the premise of realizing the reduction of the coupling capacitance of the data line Data and the power signal line PVDD. This not only simplifies the process flow, but also saves the mask used for separately forming the organic layer 4, thereby reducing the manufacturing cost.

In some embodiments of the present disclosure, referring to FIG. 3 again, the organic layer 4 may be located only between the data line Data and the power signal line PVDD. For example, the width of the organic layer 4 in the second direction may be smaller than or equal to the spacing between the data line Data and the power signal line PVDD in the second direction. In this way, the organic layer 4 can reduce the coupling capacitance between the data line Data and the power signal line PVDD so as to reduce the influence of the coupling capacitance on the data signal. Further, it also ensures that the inorganic passivation layer 2 can fully cover the data line Data and the power signal line PVDD, thereby better avoiding water vapor intrusion into the data line Data and the power signal line PVDD.

Figure 4:
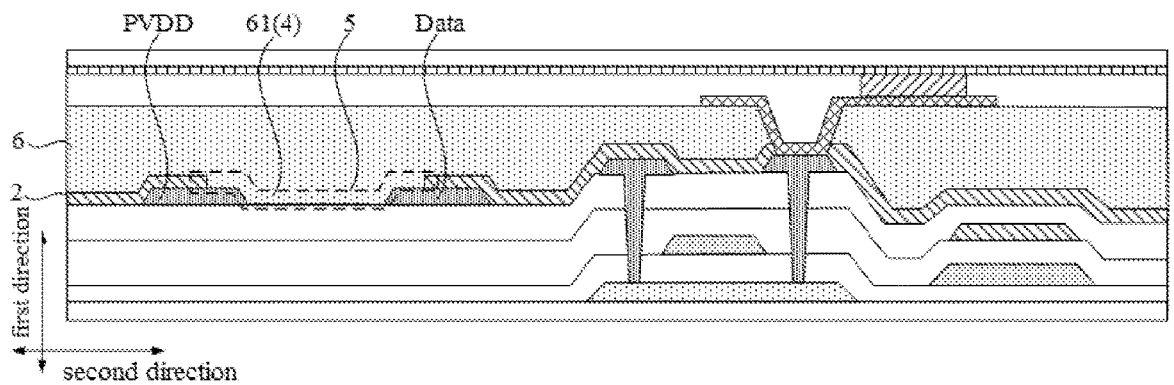
FIG. 4 is a structural schematic diagram showing an anti-crosstalk structure according to another embodiment of the present disclosure.

FIG. 4 is a structural schematic diagram showing an anti-crosstalk structure according to another embodiment of the present disclosure. As shown in FIG. 4, a partial region of the organic layer 4 is located between the data line Data and the power signal line PVDD, and the remaining region of the organic layer 4 partially overlaps with the data line Data and also partially overlaps with the power signal line PVDD. That is, the length of the organic layer 4 in the second direction is larger than the spacing between the data line Data and the power signal line PVDD. With this arrangement, the inorganic passivation layer 2 partially covers the data line Data and the power signal line PVDD, and can still prevent water vapor from intruding into the data line Data and the power signal line PVDD to some extent. In addition, it is found through experimental research that by increasing the coverage area of the organic layer 4, the coupling capacitance between the data line Data and the power signal line PVDD can be reduced by about 30.39%, so that the coupling effect between the data line Data and the power signal line PVDD can be reduced to a greater extent, thereby further reducing interference of the coupling effect on the data signal.

Figure 5:
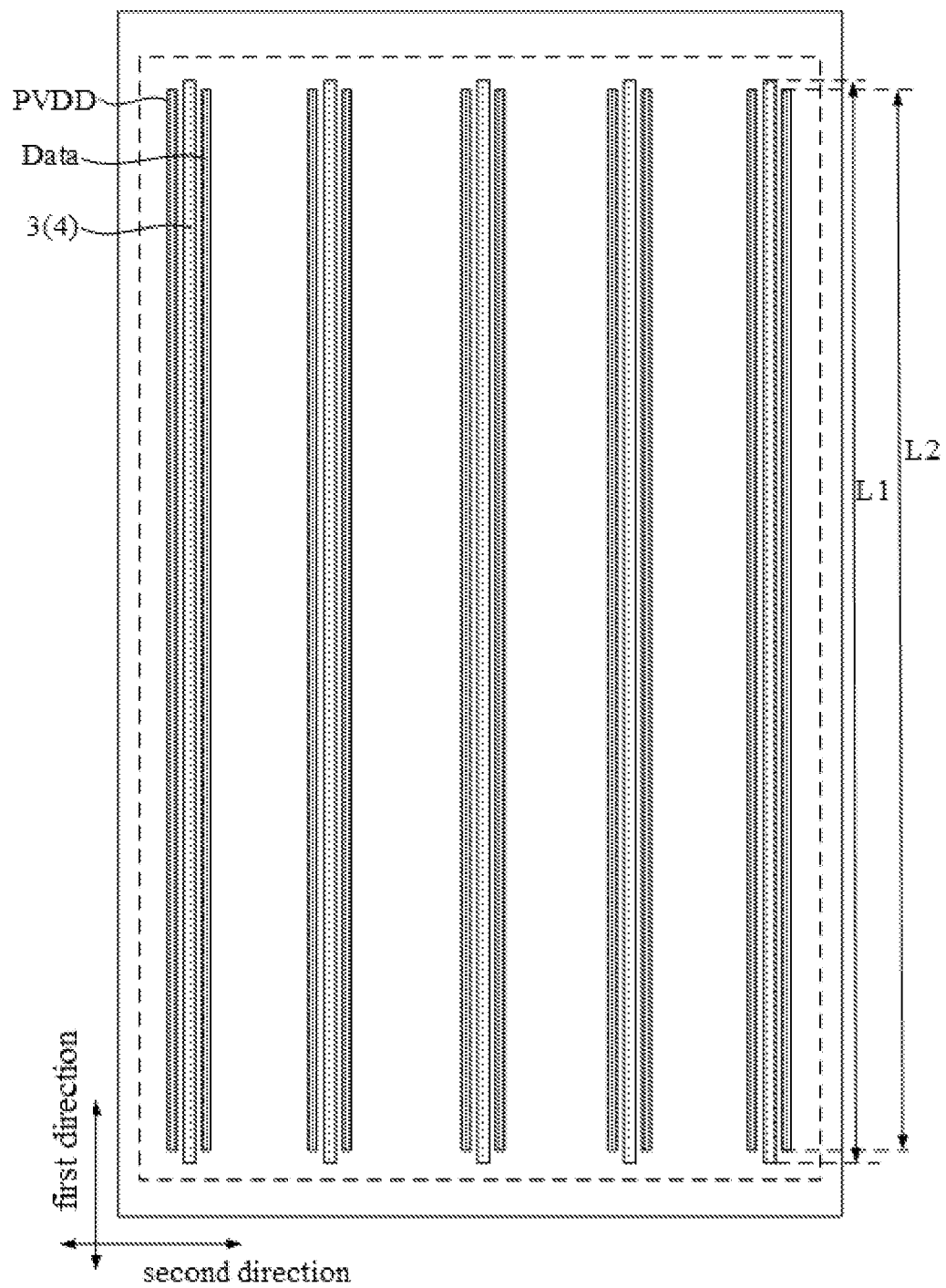
FIG. 5 is a top view of an anti-crosstalk structure according to an embodiment of the present disclosure.

FIG. 5 is a top view of an anti-crosstalk structure according to an embodiment of the present disclosure. Further, as shown in FIG. 5, the length L1 of the organic layer 4 in the first direction can be set to be greater than or equal to the length L2 of the data line Data adjacent thereto in the first direction, so that the coupling effect of the entire data line Data can be comprehensively alleviated by using the organic layer 4, thereby further reducing the influence of the coupling effect on the data signal, and further improving the display performance.

Figure 6:
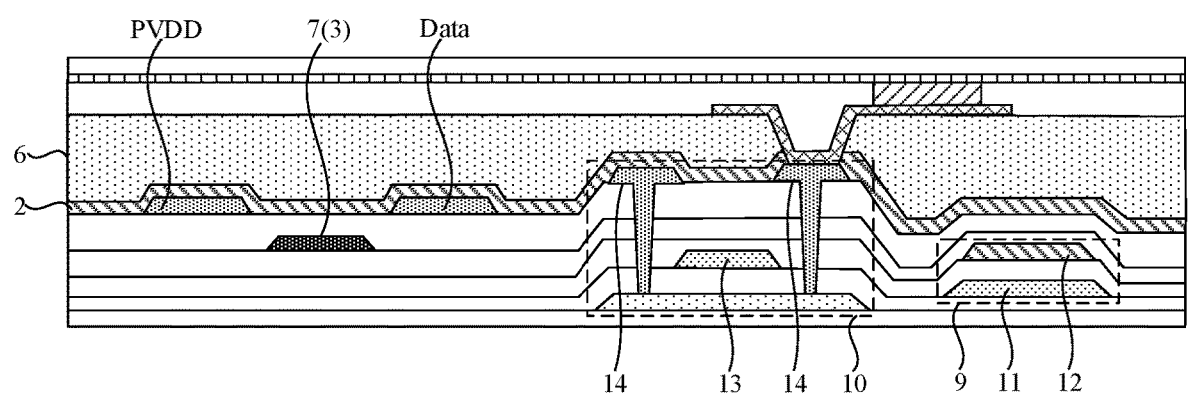
FIG. 6 is a structural schematic diagram showing an anti-crosstalk structure according to still another embodiment of the present disclosure.

FIG. 6 is a structural schematic diagram showing an anti-crosstalk structure according to still another embodiment of the present disclosure. As shown in FIG. 6, the anti-crosstalk structure 3 is a metal layer 7. When the coupling effect occurs between the data line Data and the power signal line PVDD, the interference charge can be conducted away through the metal layer 7, thereby preventing the interference charge from being further transmitted to the data line Data, and preventing the interference charge from interfering with the data signal on the data line Data.

Further, based on the characteristic of the electric charge flowing from a high potential to a low potential, in order to speed up the conduction speed of the interference charge, the metal layer 7 may be electrically connected to a fixed-potential signal terminal, for example, by providing a signal terminal having a fixed potential lower than the potential of the power signal. In this case, when a coupling effect occurs between the data line Data and the power signal line PVDD and a coupled electric field is generated, the metal layer 7 receiving the fixed potential can at least partially cut off the electric field lines formed between the data line Data and the power signal line PVDD, thereby reducing the coupled electric field between the data line Data and the power signal line PVDD and reducing the coupling effect between the data line Data and the power signal line PVDD.

In some embodiment, the metal layer 7 is electrically connected to a reference voltage signal terminal configured to supply a reference voltage signal to the pixel circuit 1, or a low-potential signal terminal.

It can be understood that, referring to FIG. 6 again, in order to drive the display panel to display an image, each pixel circuit 1 includes a storage capacitor 9 and a thin film transistor 10. The storage capacitor 9 includes a first electrode 11 and a second electrode 12. The thin film transistor 10 includes a gate layer 13 and a source-drain layer 14. The first electrode 11 and the gate layer 13 are arranged in a same layer. The source-drain layer 14, the data line Data and the power signal line PVDD are arranged in a same layer.

Based on this, referring to FIG. 6 again, the film layer in which the metal layer 7 is located may be located between the source-drain layer 14 and the second electrode 12. When the metal layer 7 is located between the source-drain layer 14 and the second electrode 12, the metal layer 7 is relatively close to the data line Data and the power signal line PVDD. In this way, not only the conduction speed and conduction amount of the interference charge can be increased, but also the electric field line formed between the data line Data and the power signal line PVDD can be cut off to a greater extent, thereby reducing the coupling effect between the data line Data and the power signal line PVDD to a greater extent. Meanwhile, compared to the related art, the coupling capacitance between the data line Data and the power signal line PVDD can be reduced by about 43.49%.

Figure 7:
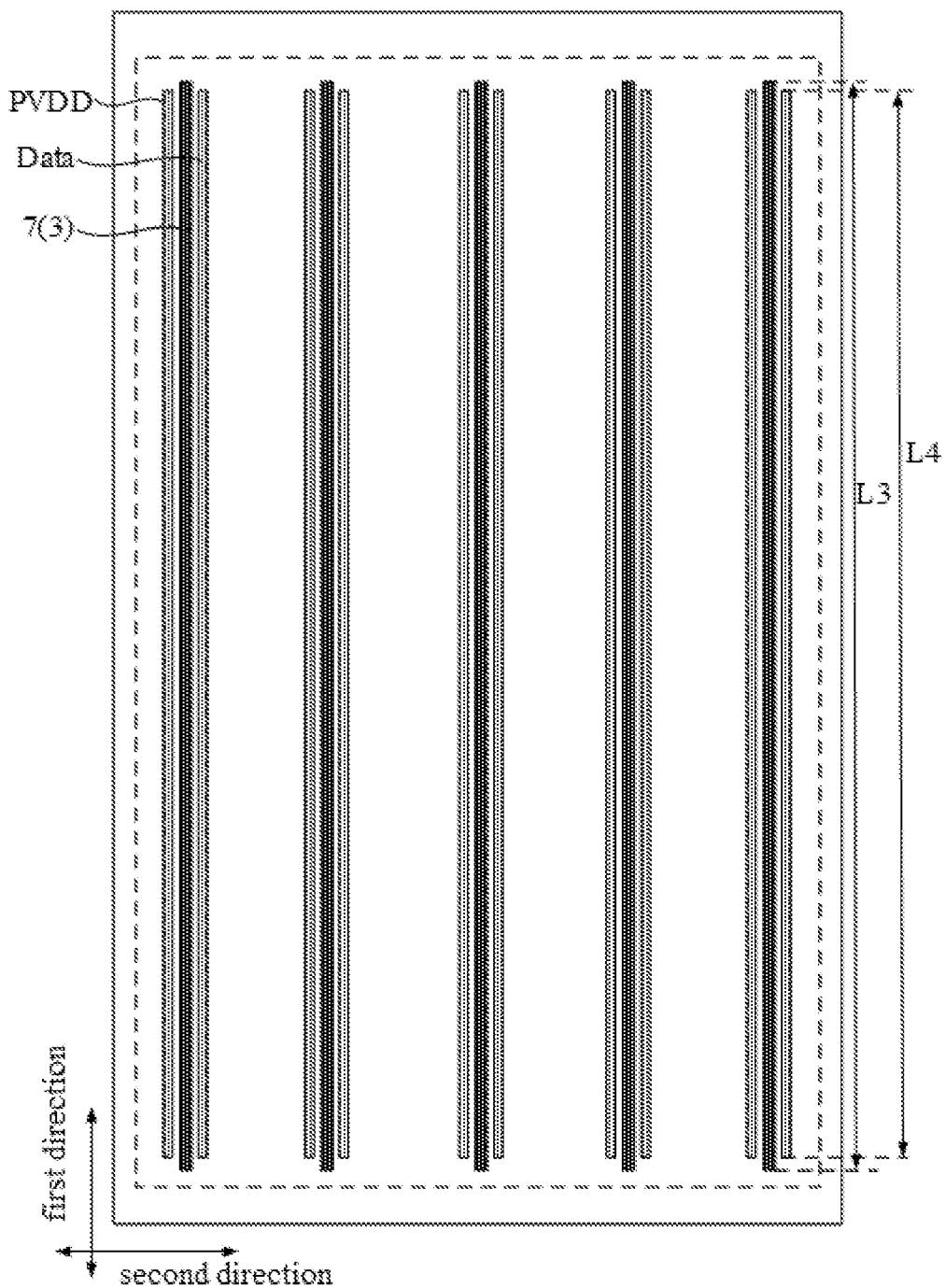
FIG. 7 is a top view of an anti-crosstalk structure according to another embodiment of the present disclosure.

FIG. 7 is a top view of an anti-crosstalk structure according to another embodiment of the present disclosure. Further, as shown in FIG. 7, the length L3 of the metal layer 7 in the first direction is greater than or equal to the length L4 of the data line Data adjacent thereto in the first direction. As a result, the coupling effect of the entire data line Data can be comprehensively reduced by using the metal layer 7, thereby further reducing the influence of the coupling effect on the data signal, and further improving the display performance to a greater extent. In addition, it should be noted that when the metal layer 7 is located between the source-drain layer 14 and the second electrode 12, the metal layer 7 is an additionally added metal film layer which is not arranged in the same layer as any of other metal film layers. Therefore, increasing the length of the metal layer 7 in the first direction has no influence on the signals transmitted on other metal film layers.

Figure 8:
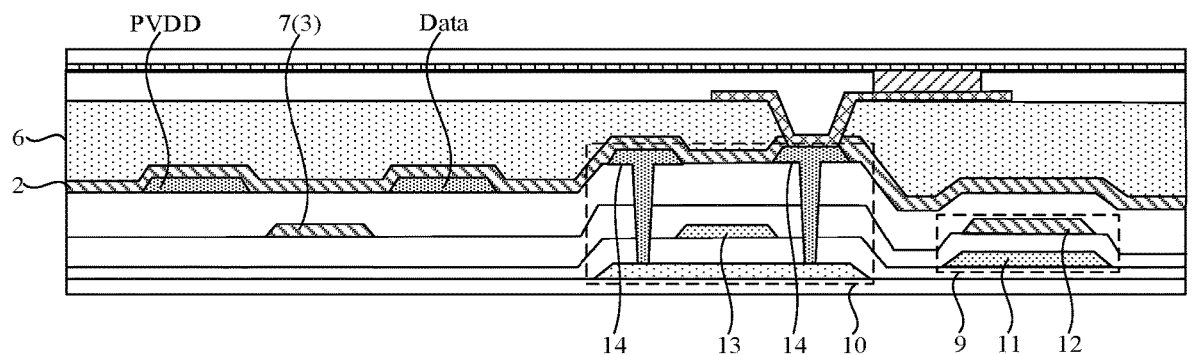
FIG. 8 is a structural schematic diagram showing an anti-crosstalk structure according to still another embodiment of the present disclosure.
Figure 9:
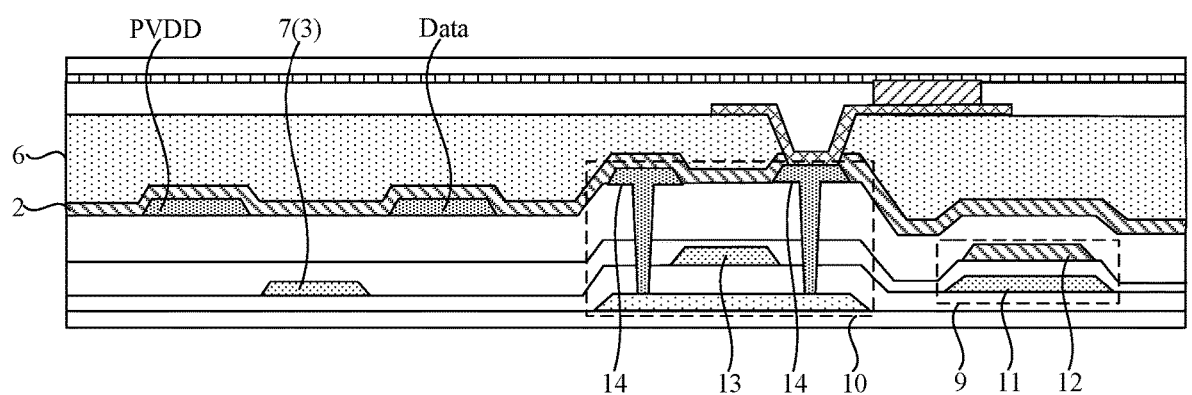
FIG. 9 is a structural schematic diagram showing an anti-crosstalk structure according to still another embodiment of the present disclosure.

FIG. 8 is a structural schematic diagram showing an anti-crosstalk structure according to still another embodiment of the present disclosure. As shown in FIG. 8, the metal layer 7 and the second electrode 12 are arranged in the same layer. FIG. 9 is a structural schematic diagram showing an anti-crosstalk structure according to still another embodiment of the present disclosure. Alternatively, as shown in FIG. 9, the metal layer 7 and the gate layer 13 may be arranged in the same layer. With such an arrangement, the metal layer 7 is formed without using an additional patterning process, and can be formed with the second electrode 12 or the gate layer 13 through one patterning process, which simplifies the process flow and reduces the manufacturing cost. Moreover, the metal layer 7 does not need to additionally occupy the space of the film layers, and thus does not increase the thickness of the display panel, thereby achieving a lighter and thinner design of the display panel.

Figure 10:
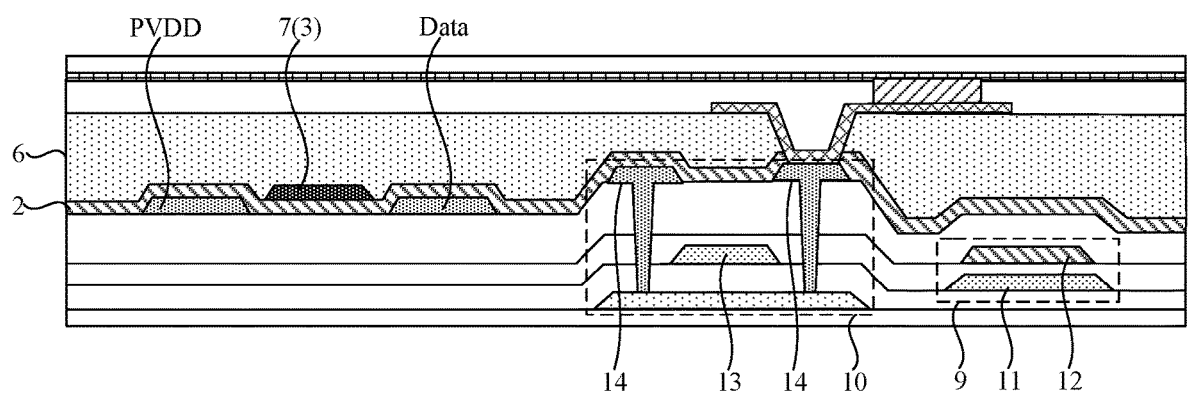
FIG. 10 is a structural schematic diagram showing an anti-crosstalk structure according to still another embodiment of the present disclosure.

FIG. 10 is a structural schematic diagram showing an anti-crosstalk structure according to still another embodiment of the present disclosure. Alternatively, as shown in FIG. 10, the metal layer 7 is located on a side of the inorganic passivation layer 2 facing toward the light-emitting surface of the display panel. For example, the metal layer 7 is located between the inorganic passivation layer 2 and the planarization layer 6.

It should be noted that, since the gap between the current data line Data and power signal line PVDD is small, if the metal layer 7, the data line Data and the power signal line PVDD are arranged in a same layer, the gap between the metal layer 7 and the data line Data and the power signal line PVDD will be smaller. This arrangement may leave some area un-etched during the patterning process, causing the data line Data and the power signal line PVDD to be short-circuited. By providing the metal layer 7 on the side of the data line Data facing toward the light-emitting surface of the display panel or on the side of the data line Data facing away from the light-emitting surface, the metal layer 7 can prevent the data line Data and the power signal line PVDD from being short-circuited while reducing the coupling effect between the data line Data and the power signal line PVDD, thereby improving the accuracy of signal transmission.

In other words, with such an arrangement, the data line Data and the power signal line PVDD can maintain the original spacing therebetween and there is no need to increase the spacing between the data line Data and the power signal line PVDD in order to avoid the influence of the metal layer 7 on the data signal and the power signal. Therefore, a better design of the display panel with a high resolution and a high screen-to-body ratio is achieved.

In some embodiments of the present disclosure, referring to FIGS. 6-10 again, the orthographic projection of the metal layer 7 on the plane of the display panel may be only located between the orthographic projection of the data line Data and orthographic projection of the power signal line PVDD on the plane of the display panel. That is, the length of the metal layer 7 in the second direction is less than or equal to the spacing between the data line Data and the power signal line PVDD.

Figure 11:
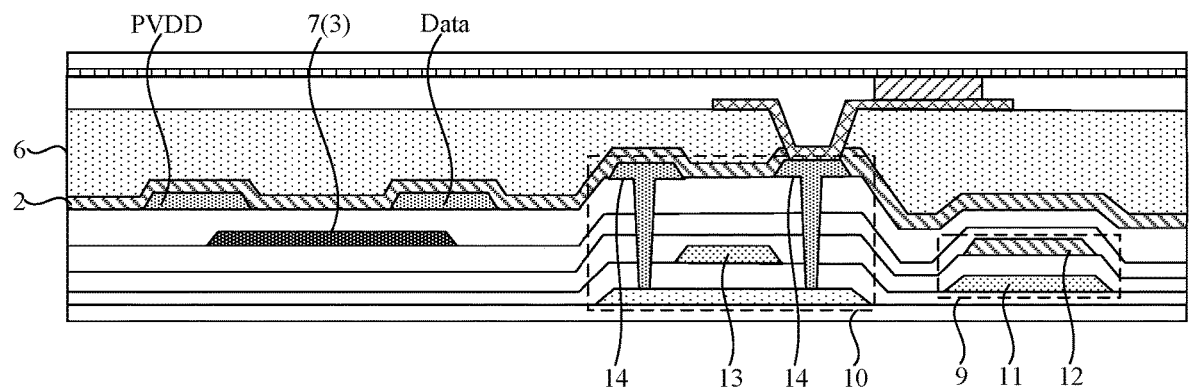
FIG. 11 is a structural schematic diagram showing an anti-crosstalk structure according to still another embodiment of the present disclosure.
Figure 12:
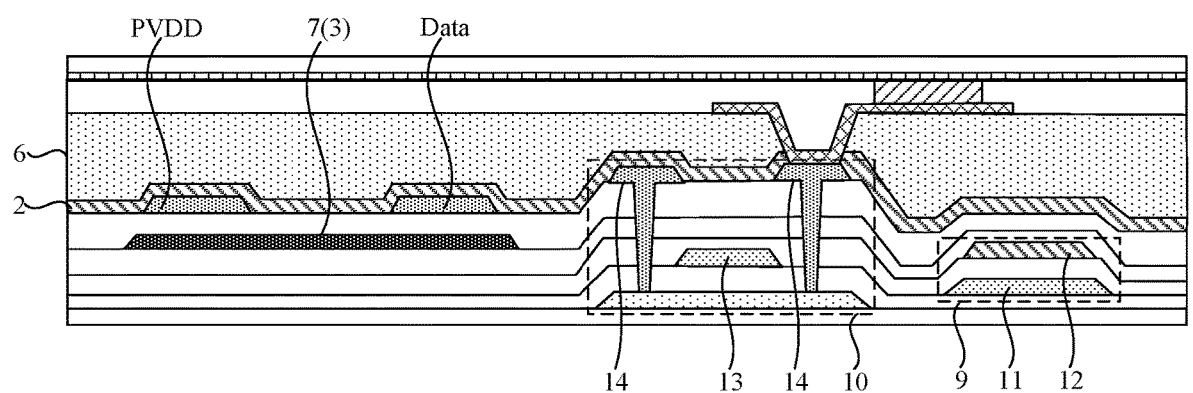
FIG. 12 is a structural schematic diagram showing an anti-crosstalk structure according to still another embodiment of the present disclosure.

Alternatively, in some embodiments of the present disclosure, in order to enable the metal layer 7 to alleviate the coupling effect between the data line Data and the power signal line PVDD to a greater extent, the orthographic projection of the metal layer 7 on the plane of the display panel may partially overlap with the orthographic projection of the data line Data and the orthographic projection of the power signal line PVDD on the plane of the display panel. FIG. 11 is a structural schematic diagram showing an anti-crosstalk structure according to still another embodiment of the present disclosure. For example, as shown in FIG. 11, the orthographic projection of the metal layer 7 on the plane of the display panel partially overlaps with the orthographic projection of the data line Data and the orthographic projection of the power signal line PVDD on the plane of the display panel. In this case, the coupling capacitance between the data line Data and the power signal line PVDD can be reduced by about 45.06% compared with the related art. FIG. 12 is a structural schematic diagram showing an anti-crosstalk structure according to still another embodiment of the present disclosure. Alternatively, as shown in FIG. 12, the orthographic projection of the metal layer 7 on the plane of the display panel fully overlaps with the orthographic projection of the data line Data and the orthographic projection of the power signal line PVDD on the plane of the display panel. In this case, the coupling capacitance between the data line Data and the power signal line PVDD can be reduced by about 46.19% compared with the related art.

Figure 13:
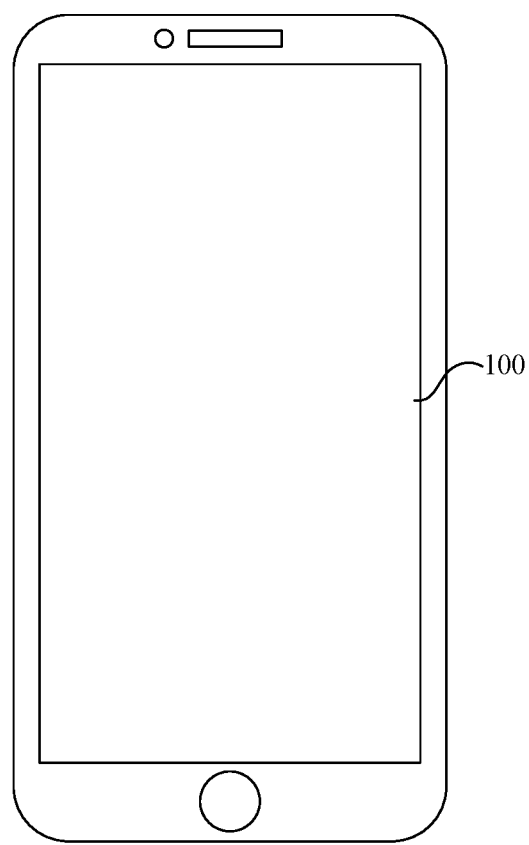
FIG. 13 is a structural schematic diagram showing a display device according to an embodiment of the present disclosure.

The present disclosure further provides a display device. FIG. 13 is a structural schematic diagram showing a display device according to an embodiment of the present disclosure. As shown in FIG. 13, the display device includes the display panel 100 described above. The specific structure of the display panel 100 has been described in detail in the above embodiments, which is not repeated herein. The display device shown in FIG. 13 is merely exemplary, and the display device may be any electronic device having a display function such as a mobile phone, a tablet computer, a laptop computer, an e-book, a television, and so on.

The display device provided by the embodiments of the present disclosure includes the above display panel 100. Similarly, in the display device provided by the embodiments of the present disclosure, by providing the anti-crosstalk structure 3, at least partial region of which is located between the data line Data and the power signal line PVDD, the anti-crosstalk structure 3 can function to alleviate the coupling effect between the data line Data and the power signal line PVDD and reduce the influence of the coupling effect on the data signal transmitted on the data line Data, making the data signal approximate to the target value, and in turn effectively eliminating the crosstalk phenomenon of the displayed images and improving the display performance.

The above are merely preferred embodiments of the present disclosure, which, as mentioned above, are not used to limit the present disclosure. Any modification, equivalent substitution, improvement, etc., made within the principles of the present disclosure, shall fall into the protection scope of the present disclosure.

What is claimed is:

1. A display panel, comprising:
   a plurality of pixel circuits arranged in a matrix;
   a data line extending in a first direction and being electrically connected to the plurality of pixel circuits;
   a power signal line extending in the first direction and being electrically connected to the plurality of pixel circuits;
   an inorganic passivation layer located on surfaces of the data line and the power signal line, wherein the surfaces are facing toward a light-emitting surface of the display panel; and
   an anti-crosstalk structure, wherein an orthographic projection of at least partial region of the anti-crosstalk structure on a plane of the display panel is located between an orthographic projection of the data line and an orthographic projection of the power signal line on the plane of the display panel,
   wherein the anti-crosstalk structure is an organic layer, the inorganic passivation layer includes a hollow region, and the organic layer is located in the hollow region.

2. The display panel according to claim 1, wherein the organic layer has a dielectric constant of $\varepsilon$, where $1 \leq \varepsilon \leq 3$.

3. The display panel according to claim 1, further comprising a planarization layer located on a surface of the inorganic passivation layer facing toward the light-emitting surface, wherein a portion of the planarization layer deposited in the hollow region is reused as the organic layer.

4. The display panel according to claim 1, wherein the organic layer is located between the data line and the power signal line.

5. The display panel according to claim 1, wherein a partial region of the organic layer is located between the data line and the power signal line, and a remaining region of the organic layer partially overlaps with the data line and the power signal line.

6. The display panel according to claim 1, wherein a length of the organic layer in the first direction is greater than or equal to a length of the data line adjacent thereto in the first direction.

7. The display panel according to claim 1, wherein the anti-crosstalk structure is a metal layer.

8. The display panel according to claim 7, wherein the metal layer is electrically connected to a fixed-potential signal terminal.

9. The display panel according to claim 8, wherein the metal layer is electrically connected to a reference voltage signal terminal or to a low-potential signal terminal.

10. The display panel according to claim 7, wherein the plurality of pixel circuits comprises a storage capacitor and a thin film transistor, the storage capacitor comprises a first electrode and a second electrode, and the thin film transistor comprises a gate layer and a source-drain layer, wherein
    the first electrode and the gate layer are arranged in the same layer; and
    a film layer where the metal layer is located is located between the source-drain layer and the second electrode.

11. The display panel according to claim 10, wherein a length of the metal layer in the first direction is greater than or equal to a length of the data line adjacent thereto in the first direction.

12. The display panel according to claim 7, wherein the plurality of pixel circuits comprises a storage capacitor and a thin film transistor, the storage capacitor comprises a first electrode and a second electrode, and the thin film transistor comprises a gate layer and a source-drain layer, wherein
the first electrode and the gate layer are arranged in the same layer; and
the metal layer and the second electrode are arranged in the same layer, or the metal layer and the gate layer are arranged in the same layer.

13. The display panel according to claim 7, wherein the metal layer is located on a side of the inorganic passivation layer facing toward the light-emitting surface.

14. The display panel according to claim 7, wherein an orthographic projection of the metal layer on the plane of the display panel is located between the orthographic projection of the data line and the orthographic projection of the power signal line on the plane of the display panel.

15. The display panel according to claim 7, wherein an orthographic projection of the metal layer on the plane of the display panel at least partially overlaps with the orthographic projection of the data line and with the orthographic projection of the power signal line on the plane of the display panel.

16. A display device comprising a display panel, wherein the display panel comprises:
a plurality of pixel circuits arranged in a matrix;
a data line extending in a first direction and being electrically connected to the plurality of pixel circuits;
a power signal line extending in the first direction and being electrically connected to the plurality of pixel circuits;
an inorganic passivation layer located on surfaces of the data line and the power signal line, wherein the surfaces face toward a light-emitting surface of the display panel; and
an anti-crosstalk structure, wherein an orthographic projection of at least partial region of the anti-crosstalk structure on a plane of the display panel is located between an orthographic projection of the data line and an orthographic projection of the power signal line on the plane of the display panel,
wherein the anti-crosstalk structure is an organic layer, the inorganic passivation layer includes a hollow region, and the organic layer is located in the hollow region.

* * * * *